United States Patent
Goodby et al.

(10) Patent No.: US 6,951,700 B2
(45) Date of Patent: Oct. 4, 2005

(54) USE OF A COMPOSITION IN STEREOLITHOGRAPHY

(75) Inventors: John W Goodby, Hull (GB); Alan W Hall, Hull (GB); Keith M Blackwood, Yardley, PA (US); Paul E Y Milne, Worcs (GB); Andrew G Biggs, Worcs (GB); Ryan M Heath, Worcs (GB); Robert W Bannister, Worcs (GB)

(73) Assignee: Qinetiq Limited, Farnborough (GB)

( * ) Notice: Subject to any disclaimer, the term of this patent is extended or adjusted under 35 U.S.C. 154(b) by 0 days.

(21) Appl. No.: 10/148,673

(22) PCT Filed: Nov. 30, 2000

(86) PCT No.: PCT/GB00/04756

§ 371 (c)(1),
(2), (4) Date: Nov. 6, 2002

(87) PCT Pub. No.: WO01/40874

PCT Pub. Date: Jun. 7, 2001

(65) Prior Publication Data

US 2003/0157435 A1 Aug. 21, 2003

(30) Foreign Application Priority Data

Dec. 4, 1999 (GB) ............................................. 9928621

(51) Int. Cl.$^7$ .......................... G03F 7/027; B29C 67/00; G03C 9/08
(52) U.S. Cl. ................... 430/18; 430/288.1; 430/284.1; 430/286.1; 430/287.1; 430/269; 264/401
(58) Field of Search ......................... 430/281.1, 283.1, 430/284.1, 288.1, 257.1, 286.1, 269, 18; 264/401

(56) References Cited

U.S. PATENT DOCUMENTS

| 3,912,693 | A | * | 10/1975 | Shimizu et al. ............... 522/14 |
| 3,957,699 | A | | 5/1976 | Solomon et al. ........ 260/21.1 E |
| 4,121,986 | A | | 10/1978 | Battaerd ................. 204/159.22 |
| 4,540,650 | A | * | 9/1985 | Klug et al. ............... 430/281.1 |
| 5,055,372 | A | | 10/1991 | Shanklin et al. ............ 430/138 |
| 6,350,840 | B1 | * | 2/2002 | Schultz et al. .............. 526/305 |
| 6,559,261 | B1 | * | 5/2003 | Milne et al. ................. 526/312 |
| 6,608,120 | B1 | * | 8/2003 | Milne et al. ................. 522/171 |
| 2003/0225231 | A1 | * | 12/2003 | Hall ........................... 526/274 |

FOREIGN PATENT DOCUMENTS

| EP | 0 103 225 A | 3/1984 |
| EP | 0 547 555 A | 6/1993 |

(Continued)

OTHER PUBLICATIONS

Xi et al , J. Macromol. Sci.Chem, A20(3),pp. 321–330 (1983).*

(Continued)

*Primary Examiner*—Cynthia Hamilton
(74) *Attorney, Agent, or Firm*—Nixon & Vanderyhye P.C.

(57) ABSTRACT

The use of a compound of formula (A), which comprises a group of sub-formula (I) where $R^1$, $R^2$, $R^3$, $R^4$, $R^5$, $R^6$, $X^1$ and $Y^1$ are various specified organic groups wherein at least one of said groups has sufficient electron whitdrawing properties to activate the multiple bonds to polymerisation, in a stereolithographic composition. Stereolithographic applications of these compounds are also described and claimed.

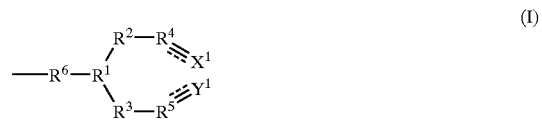

29 Claims, 2 Drawing Sheets

FOREIGN PATENT DOCUMENTS

Figure 1:
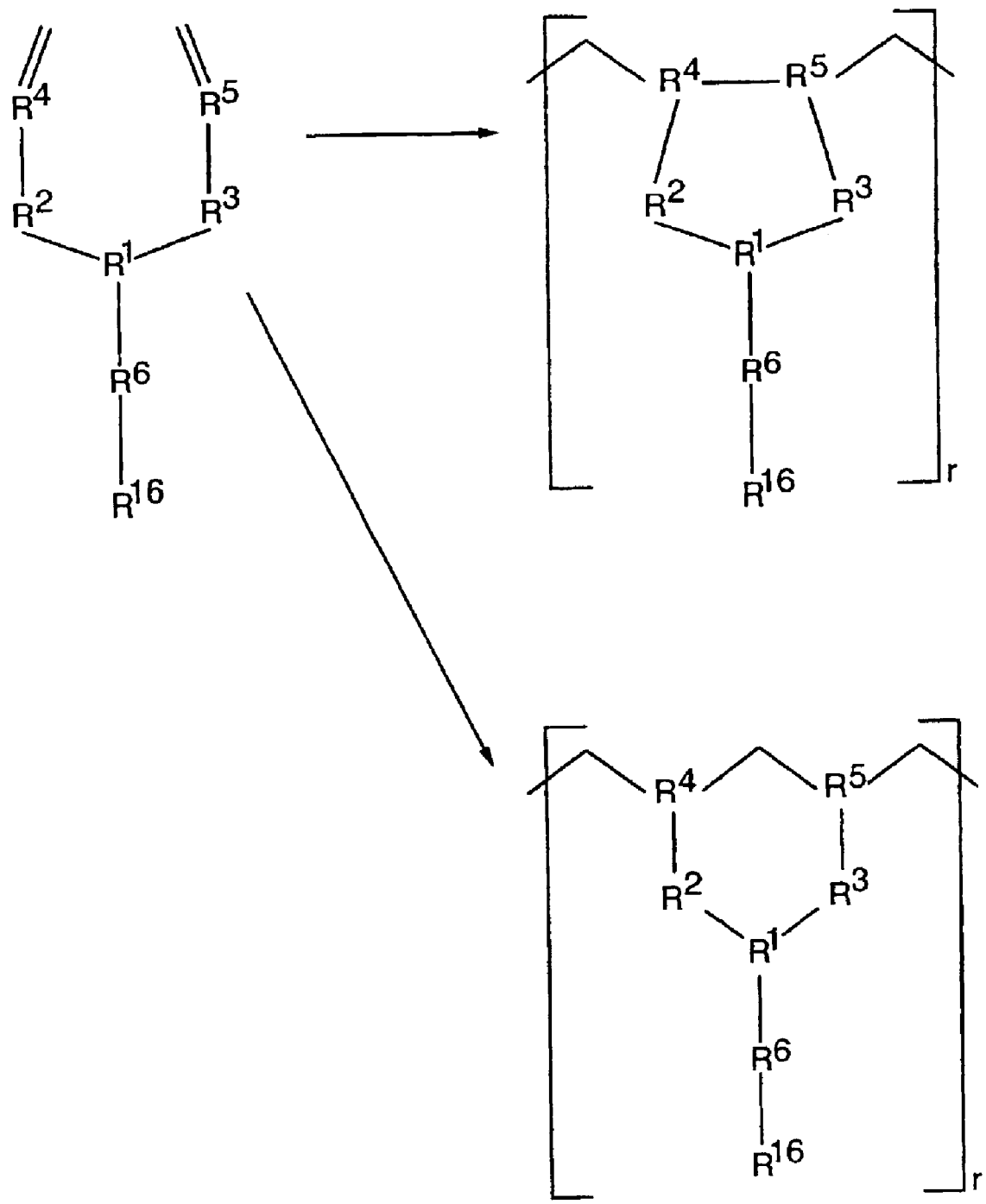

| | | |
|---|---|---|
| WO | WO 97/16471 A1 * | 5/1997 |
| WO | WO 97/16472 A1 * | 5/1997 |
| WO | WO 97/36908 A1 * | 10/1997 |
| WO | WO 00/06533 A2 * | 2/2000 |
| WO | WO 00/06610 A2 * | 2/2000 |
| WO | 00 06610 A | 2/2000 |
| WO | WO 00/06658 A2 * | 2/2000 |
| WO | WO 00/06666 A1 * | 2/2000 |
| WO | 00 20926 A | 4/2000 |

OTHER PUBLICATIONS

Babu et al (108:38480) Chemical Abstracts ACS on STN, abstract of Journal of Macromolecular Science, Chemistry (1988), A25 (1), 109–13. one page.*

Jakus et al (99:105814) Chemical Abstracts ACS on STN, abstract of Proc. IUPAC, I.U.P.A.C., Macromol. Symp., $28^{th}$ (1982), 171 Publisher: Int. Union Pure Appl. Chem, Oxford UK one page.*

Marek et al; "Preparation of a Multilayered Film of Ultrathin Poly(Tetraallylammonium Bromide) Network"; Chemistry Letters, 1993, pp. 291–294, XP002130641.

Butler et al; "Preparation and Polymerization of Unsaturated Quaternary Ammonium Compounds. V. Propargyl Deriatives"; J. of The American Chemical Society, vol. 76, 1954, pp. 713–714, XP002130640.

* cited by examiner

POLYMERISATION

COPOLYMERISATION

USE OF A COMPOSITION IN STEREOLITHOGRAPHY

The present invention relates to the use of certain photocurable compounds in stereolithography, as well as to stereolithographic compositions containing these compounds, stereolithographic methods using these compounds and products obtained thereby.

The use of stereolithography processes for producing three-dimensional objects is well known. Broadly speaking, in these processes, a requisite amount of controlled light energy is applied to a liquid photocurable resin to harden the irradiated resin. This may be done in a series of steps, each of which forms a thin layer of hardened resin on top of a base layer. A layer of liquid photocurable resin is applied to a hardened layer and then irradiated under control to harden the resin in the form of a thin layer which is integrally superposed on the previously formed layer. This process can be repeated until a desired solid three-dimensional object is built up.

Examples of modified stereolithography techniques and their applications are described for example in JP-A-60-247515, JP-A-62-35966, JP-A-1-204915, JP-A-1-213304, JP-A-2-28261 and U.S. Pat. No. 5,849,459.

A typical and commonly used process for producing a three-dimensional object by stereolithography comprises selectively applying a computer-controller ultraviolet (UV) laser beam to the surface of a liquid photohardenable resin composition. The liquid is contained in a container and the laser beam is focused so as to harden the resin to a predetermined depth (thickness) so as to form a desired shape. Subsequently liquid resin composition can be applied to the hardened layer to the thickness corresponding to one layer, and a UV laser beam applied to it so as to form a successive hardened layer on the preceding layer. Again, this procedure can be repeated until a three-dimensional object having the required dimensions and shape has been built up. This process allows three-dimensional objects having complicated shapes to be obtained easily in a relatively short time.

With the recent broadening of application of stereolithography from concept models to test models and trial products, there has been an increasing demand to provide three-dimensional objects having still higher dimensional accuracy and dimensional stability. The objects have also been demanded to have excellent mechanical properties.

Photohardenable resin compositions generally used in stereolithography comprise at least one photo-polymerisable compound, such as a photo-polymerisable modified urethane (meth)acrylate compound, an oligoester acrylate compound, an epoxyacrylate compound, an epoxy compound, a polyimide compound, an aminoalkyd compound, or a vinyl ether compound, as a main component, and a photosensitive polymerization initiator.

The polymerization of diallyamines using free radical initiation is known, for example from Solomon et al., J. Macromol. Sci.—Rev Macromol. Chem. c15 (1) 143–164 (1976). Free radical initiation of polymerization requires quite extreme reaction conditions which can be generated only in production plants etc. It is not suitable for situations where in situ polymerization is required.

Other cyclopolymerization reactions are discussed by C. D. McLean et al., J. Macromol. Sci.—Chem., A10(5), pp 857–873 (1976). Yet further reactions are described in WO 97/16504, WO 97/16472 where such reactions are used in a specialised way in the production of liquid crystal compounds.

Copending International Patent Application No. WO 00/06610 describes methods of producing polymeric compounds, in particular using radiation curing such ultraviolet or thermal radiation, or chemical curing or electron beam initiated curing. Certain compounds which form polymers under the influence of u.v. light form a further aspect of the invention, as well as to polymers, coatings and adhesives obtained thereby.

In these applications, a broad range of compounds with at least two appropriately positioned multiple bonds and in particular double bonds, may be activated by the presence of an electron withdrawing group, in particular where the electron withdrawing group is at a position which is alpha, beta or gamma to one or both of the double bonds to make them readily polymerisable under the influence of inter alia radiation. The term "readily polymerisable" means that the compounds will undergo polymerization under moderate conditions of temperature and pressure (for example at room temperature and atmospheric pressure) in the presence of radiation and an initiator, in a period of less than 24 hours.

Polymeric compounds obtained therefrom include cyclic rings. These have many advantageous properties. In particular, compounds of this type can be used to generate products such as adhesives (see copending WO 00/06658), coatings, network polymers or conducting polymers (see copending WO 00/06533) depending upon the other aspects of the structure of the starting materials.

The applicants have found that many of these compounds are particularly applicable for use in stereolithographic processes.

Specifically, the invention provides the use of a compound of formula (A), which comprises a group of subformula (I)

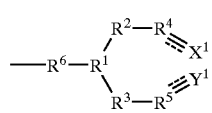

where $R^1$ is $CR^{a'}$ where $R^{a'}$ is hydrogen or alkyl, and $R^6$ is a bond, or $R^1$ and $R^6$ together form an electron withdrawing group;

$R^2$ and $R^3$ are independently selected from $(CR^7R^8)_n$, or a group $CR^9R^{10}$, $CR^7R^8CR^9R^{10}$ or $CR^9R^{10}CR^7R^8$ where n is 0, 1 or 2, $R^7$ and $R^8$ are independently selected from hydrogen or alkyl, and either one of $R^9$ or $R^{10}$ is hydrogen and the other is an electron withdrawing group, or $R^9$ and $R^{10}$ together form an electron withdrawing group, and $R^4$ and $R^5$ are independently selected from CH or $CR^{11}$ where $R^{11}$ is an electron withdrawing group;

the dotted lines indicate the presence or absence of a bond, and $X^1$ is a group $CX^2X^3$ where the dotted line bond to which it is attached is absent and a group $CX^2$ where the dotted line bond to which it is attached is present, $Y^1$ is a group $CY^2Y^3$ where the dotted line bond to which it is attached is absent and a group $CY^2$ where the dotted line bond to which it is attached is present, and $X^2$, $X^3$, $Y^2$ and $Y^3$ are independently selected from hydrogen and fluorine;

provided that at least one of (a) $R^1$ and $R^6$ or (b) $R^2$ and $R^3$ or (c) $R^4$ and $R^5$ includes an electron withdrawing group which is able to activate a cyclopolymerization reaction under the influence of radiation used in a stereolithographic process optionally in the presence of a photoinitiator; in a stereolithographic composition.

Conditions under which polymerization will occur are those which are used in stereolithography and include the influence of radiation such as u.v. or laser generated radiation or an electron beam.

Compounds of formula (A) may comprise one or more groups of sub-formula (I) which may be attached to a variety of organic groups. Where the compound of formula (A) includes more than one group of sub-formula (I), these may be connected directly to each other or interposed by various bridging groups as described below.

Figure 2:
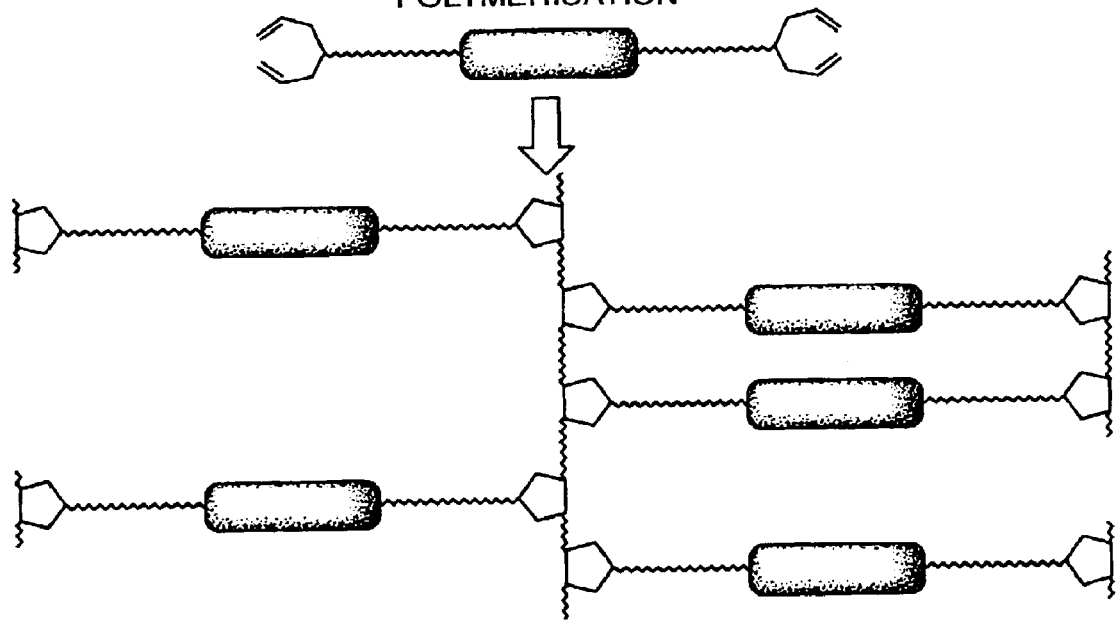
Figure 2:
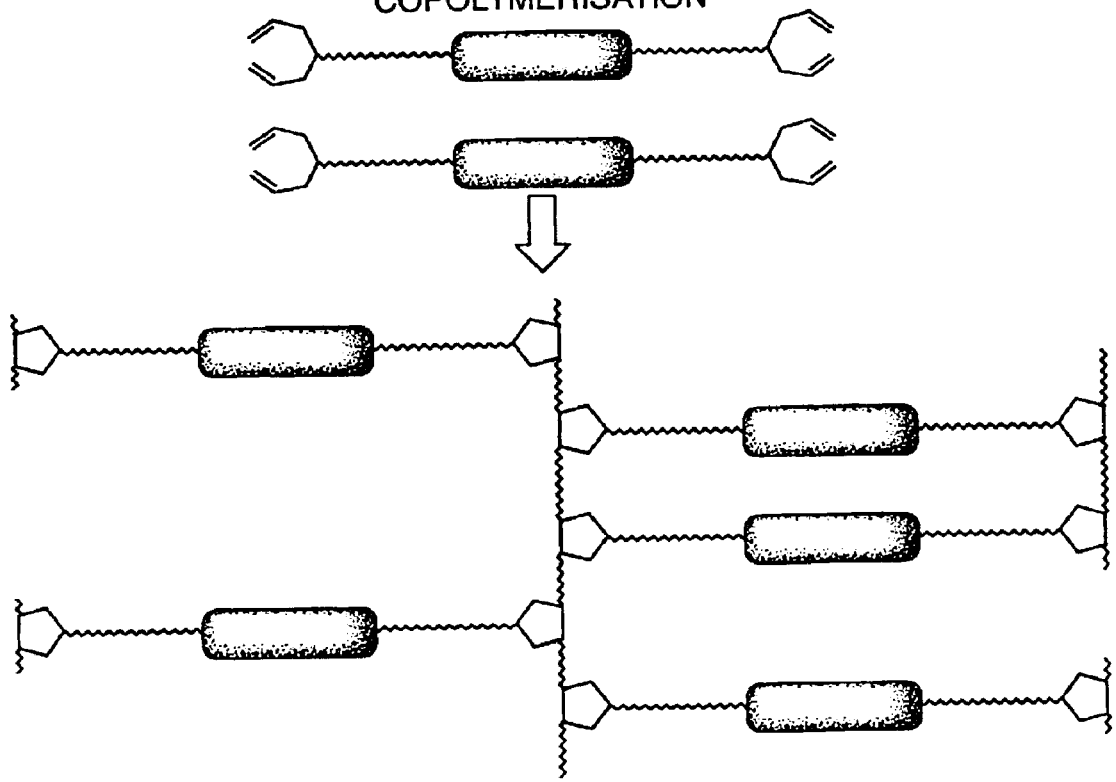

The following description of the invention refers to the attached Figures in which:

FIG. 1 FIG. 1 illustrates the polymerization which may be used in accordance with the invention; and FIG. 2 shows a general scheme whereby cross-linking to form network polymers may occur.

In particular $X^1$ and $Y^1$ are groups $CX^2X^3$ and $CY^1Y^2$ respectively and the dotted lines represent an absence of a bond. Thus preferred compounds are compounds of formula (B) which include a group of sub-formula (IA)

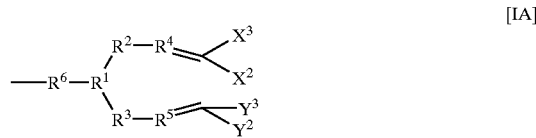

[IA]

where $R^1$, $R^2$, $R^3$, $R^4$, $R^5$, $R^6$, $X^2$, $X^3$, $Y^2$ and $Y^3$ are as defined above.

Suitably there are no more than five atoms in between or linking the double bonds in the group of sub-formula (IA) in the starting material so that when the cyclopolymerization takes place, for example as illustrated hereinafter in FIG. 1, the size of the rings formed does not exceed 7. Preferably, there are from 3 to 5 atoms in between the double bonds.

As used herein, the term "alkyl" refers to straight or branched chain alkyl groups, suitably containing up to 20 and preferably up to 6 carbon atoms. The term "alkenyl" and "alkynyl" refer to unsaturated straight or branched chains which include for example from 2–20 carbon atoms, for example from 2 to 6 carbon atoms. Chains may include one or more double or triple bonds respectively. In addition, the term "aryl" refers to aromatic groups such as phenyl or naphthyl.

The term "hydrocarbyl" refers to any structure comprising carbon and hydrogen atoms. For example, these may be alkyl, alkenyl, alkynyl, aryl such as phenyl or napthyl, arylalkyl, cycloalkyl, cycloalkenyl or cycloalkynyl. Suitably they will contain up to 20 and preferably up to 10 carbon atoms. The term "heterocyclyl" includes aromatic or non-aromatic rings, for example containing from 4 to 20, suitably from 5 to 10 ring atoms, at least one of which is a heteroatom such as oxygen, sulphur or nitrogen. Examples of such groups include furyl, thienyl, pyrrolyl, pyrrolidinyl, imidazolyl, triazolyl, thiazolyl, tetrazolyl, oxazolyl, isoxazolyl, pyrazolyl, pyridyl, pyrimidinyl, pyrazinyl, pyridazinyl, triazinyl, quinolinyl, iosquinolinyl, quinoxalinyl, benzthiazolyl, benzoxazolyl, benzothienyl or benzofuryl.

The term "functional group" refers to reactive groups such as halo, cyano, nitro, oxo, $C(O)_sR^a$, $OR^a$, $S(O)_tR^a$, $NR^bR^c$, $OC(O)NR^bR^c$, $C(O)NR^bR^c$, $OC(O)NR^bR^c$, $-NR^7C(O)_sR^6$, $-NR^aCONR^bR^c$, $-C=NOR^a$, $-N=CR^bR^c$, $S(O)_tNR^bR^c$, $C(S)_sR^a$, $C(S)OR^a$, $C(S)NR^bR^c$ or $-NR^bS(O)_tR^a$ where $R^a$, $R^b$ and $R^c$ are independently selected from hydrogen or optionally substituted hydrocarbyl, or $R^b$ and $R^c$ together form an optionally substituted ring which optionally contains further heteroatoms such as $S(O)_s$, oxygen and nitrogen, s is an integer of 1 or 2, t is 0 or an integer of 1–3. In particular the functional groups are groups such as halo, cyano, nitro, oxo, $C(O)_sR^a$, $OR^a$, $S(O)_tR^a$, $NR^bR^c$, $OC(O)NR^bR^c$, $C(O)NR^bR^c$, $OC(O)NR^bR^c$, $-NR^bR^c$, $-NR^7C(O)_sR^6$, $-NR^aCONR^bR^c$, $-NR^aCSNR^bR^c$, $-C=NOR^a$, $-N=CR^bR^c$, $S(O)_tNR^bR^c$, or $-NR^bS(O)_tR^a$ where $R^a$, $R^b$ and $R^c$, s and t are as defined above.

The term "heteroatom" as used herein refers to non-carbon atoms such as oxygen, nitrogen or sulphur atoms. Where the nitrogen atoms are present, they will generally be present as part of an amino residue so that they will be substituted for example by hydrogen or alkyl.

The term "amide" is generally understood to refer to a group of formula $C(O)NR^aR^b$ where $R^a$ and $R^b$ are hydrogen or an optionally substituted hydrocarbyl group. Similarly, the term "sulphonamide" will refer to a group of formula $S(O)_2NR^aR^b$.

The nature of the electron withdrawing group or groups present in the group of sub-formula (I) in any particular compound of formula (A) will depend upon its position in relation to the double bond it is required to activate, as well as the nature of any other functional groups within the compound.

In a-preferred embodiment, $R^1$ and $R^6$ form an electron withdrawing group.

For example, $R^1$ is a heteroatom or a substituted heteroatom which has electron withdrawing properties and $R^6$ is a bond. Examples of $R^1$ in this instance include groups $N^+R^{12}(Z^{m-})_{1/m}$, $S(O)_pR^{13}$, B, $P(O)_qR^{14}$ or $Si(R^{15})$ and in particular a group $N^+R^{12}(Z^{m-})_{1/m}$, $S(O)_pR^{13}$, B, $P(O)_qR^{14}$ where $R^{12}$, $R^{13}$, $R^{14}$ and $R^{15}$ are independently selected from hydrogen or hydrocarbyl, Z is an anion of charge m, p is 0, 1 or 2, and q is 1. Alternatively, $R^1$ is a group CH and $R^6$ is a group $-C(O)O-$ or $-OC(O)-$.

In a particularly preferred embodiment, $R^1$ is a group $N^+R^{12}(Z^{m-})_{1/m}$, $S(O)_pR^{13}$, B, $P(O)_qR^{14}$ or $Si(R^{15})$, and preferably $N^+R^{12}(Z^{m-})_{1/m}$, $S(O)_pR^{13}$, B, or $P(O)_qR^{14}$ where $R^{12}$, $R^{13}$, $R^{14}$ and $R^{15}$ are independently selected from hydrogen or alkyl in particular $C_{1-3}$alkyl, and Z is an anion, preferably a halide. In particular $R^1$ is a group $N^{+R12}(Z^{m-})_{1/m}$, and $R^6$ is a bond.

The nature of the anion Z will affect the properties of the final polymer and in particular, its conductivity, porosity and water permeability. Suitable anions for the Z group include halide ions such as fluoride, chloride, bromide or iodide, borides such as boron tetrafluoride; carboxylic acid esters such as those of formula $R^{14}C(O)O^-$ where $R^{14}$ is an optionally substituted hydrocarbyl group group such as haloalkyl, in particular trifluoromethyl; and other cationic groups such as mesylate and tosylate. In general, the water permeability of the ultimate polymer will vary as follows:

$PF_6^- < BF_4^- < CF_3SO_3^- < CF_3COO^- < NO_3^- < SO_4^{2-} < I^- < Br^- < Cl^-$

Other factors which affect the water permeability of the polymer is the nature of any group to which the group of sub-formula (I) is attached. When this contains for example perhaloalkyl substituents such as perfluoroalkyl, it will be largely water impermeable as compared to polymers which have alkylene bridging groups optionally interposed with say oxygen. Examples of such groups are given below.

Most preferably, the combination of $R^1$ and $R^6$ forms an amide group, where $R^1$ is a nitrogen atom and $R^6$ is a carbonyl group. In a further preferred embodiment, $R^1$ and $R^6$ together form a sulphonamide group where $R^1$ is a nitrogen atom and $R^6$ is an $S(O)_2$ group.

Alternatively, where the activation is effected by electron withdrawing groups at a position indicated by $R^2$ or $R^3$, suitable electron withdrawing groups $R^9$ and $R^{10}$ include nitrile, trifluoromethyl, acyl such as acetyl or nitro, or preferably $R^9$ and $R^{10}$ together with the carbon atom to which they are attached form a carbonyl group.

Where $R^{11}$ is an electron withdrawing group, it is suitably acyl such as acetyl, nitrile or nitro.

Preferably $X^2$, $X^3$, $Y^2$ and $Y^3$ are all hydrogen.

Suitable groups $R^{a'}$ include hydrogen or methyl, in particular hydrogen.

A preferred group of the compounds of formula (A) are compounds of structure (II)

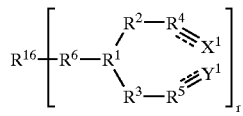

[II]

and in particular a compound of formula (IIA)

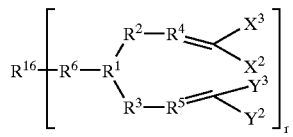

[IIA]

where $X^1$, $X^2$, $X^3$, $Y^1$, $Y^2$, $Y^3$, $R^1$, $R^2$, $R^3$, $R^4$, $R^5$, $R^6$ and the dotted bonds are as defined in relation to formulae (I) and (IA) above, r is an integer of 1 or more, and $R^{16}$ is a bridging group, an optionally substituted hydrocarbyl group, a perhaloalkyl group or an amide, of valency r.

Where in the compound of formula (II) or (IIA), r is 1, compounds can be readily polymerized to form a variety of polymer types depending upon the nature of the group $R^{16}$. Examples of groups which are commonly found in polymer technology is included below in Table 1. (In the case of these compounds however, the bridging groups will terminate for example by addition of a hydrogen or alkyl group.)

Monomers of this type may be represented as structure (III)

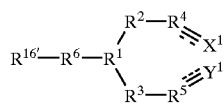

[III]

where $X^1$, $Y^1$, $R^1$, $R^2$, $R^3$, $R^4$, $R^5$, $R^6$ and the dotted lines are as defined above, and $R^{16'}$ is an optionally substituted hydrocarbyl group, a perhaloalkyl group or an amide.

A particular example of such a compound is a compound of formula (IIIA)

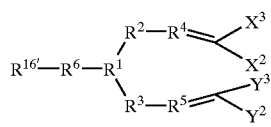

[IIIA]

where $X^2$, $X^3$, $Y^2$, $Y^3$, $R^1$, $R^2$, $R^3$, $R^4$, $R^5$ and $R^6$ are as defined in relation to formula (I) above, and $R^{16'}$ is as defined in relation to formula (III).

Preferably in the compounds of formula (III) or (IIIA) as above, $R^1$ and $R^6$ form an electron withdrawing group. Suitably then $R^2$ and $R^3$ are groups $(CR^7R^8)_n$ and $R^4$ and $R^5$ are CH groups. In one embodiment, $R^{16}$ comprises a hydrocarbyl group, optionally substituted by a functional group.

Preferably $R^7$ includes an unsaturated moiety, such as an aryl or alkenyl group, or a carbonyl substituent.

A class of compounds of formula (III) is those of formula (IV)

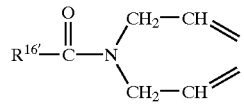

[IV]

where $R^{16'}$ is as defined above, and is in particular an optionally substituted alkyl, alkenyl, alkynyl or aryl group, wherein the optional substituents may be selected from halogen, hydroxy, carboxy or salts thereof or acyloxy.

Alternatively, $R^{16'}$ in formula (IV) may comprise a perhaloalkyl group, for example of from 1 to 3 carbon atoms such as a perhalomethyl group, in particular perfluoromethyl.

Another group for $R^{16'}$ in formula (IV) is a dialkenyl substituted amide, for example of sub formula (V)

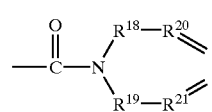

(V)

where $R^{18}$ and $R^{19}$ are selected from groups defined above for $R^2$ and $R^3$ in relation to formula (I), and are preferably —$CH_2$— or —$CH_2CH_2$— groups; and $R^{20}$ and $R^{21}$ are selected from groups defined above as $R^4$ and $R^5$ in relation to formula (I) and are preferably —CH— groups. Such groups would further activate the double bonds and give rise to the possibility of forming cross-linked polymer networks during the stereolithography process.

Another class of compound of formula (II) is represented by radiation curable compounds of formula (VI)

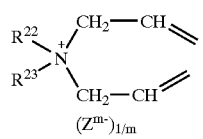

[VI]

where Z and m are as defined above, $R^{22}$ and $R^{23}$ are independently selected from hydrogen and hydrocarbyl, such as alkyl and alkenyl, in particular prop-2-enyl or hydroxyethyl.

The invention may also be applied to other sorts of polymers, for example, where in the compounds of formula (II), r is greater than one, polymerization can result in polymer networks. Particular examples are compounds of formula (II) as defined above, where $R^{16}$ is a bridging group and r is an integer of 2 or more, for example from 2 to 8 and preferably from 2–4.

On polymerization of these compounds, networks are formed whose properties may be selected depending upon the precise nature of the $R^{16}$ group, the amount of chain terminator present and the polymerization conditions employed. Polymerization will occur in accordance with the general scheme set out in FIG. 1 hereinafter.

Suitably r is an integer of from 2 to 6, preferably from 2 to 4.

The properties of the polymer obtained in this way will depend upon a variety of factors but will depend very largely on the nature of the group $R^{16}$.

Suitably $R^{16}$ will comprise bridging groups for example as is known in polymer chemistry. These may include straight or branched chain alkyl groups, optionally substituted or interposed with functional groups or siloxane groups such as alkyl siloxanes. Suitable bridging groups include those found in polyethylenes, polypropylenes, nylons, as listed in Table 1.

TABLE 1

| Polymer type | Repeat Unit of Bridging Group |
|---|---|
| Polyethylene | $CH_2$ |
| Polystyrene | $CH_2CH(C_6H_5)$ where the phenyl ring is optionally substituted |
| Polyisobutylene | $CH_2CH(CH(CH_3)_2)$ |
| Polyisoprene | $CH_2CH(CH_3)$ |
| Polytetrafluoroethylene | $CH_2(CF_2)_xCH_2$ |
| Polyvinylidenefluoride | $CH_2(CF_2CH_2)_x$ |
| polyethyleneoxide | $(OCH_2CH(CH_3))_xO$ |
| Nylon | $CH_2(NHCOCH_2)_xCH_2$ |
| Peptide | $CH_2(NHCOCH_R)_xCH_2$ |
| Polyurethanes | —NH—CO—O— |
| Polyesters | —RC(O)OR'— where R and R' are organic groups such as hydrocarbyl |
| Polysiloxanes | e.g. —$SiO_2$—, —$R_2SiO$— or —$R_2Si_2O_3$— where R is an organic group such as hydrocarbyl |
| Polyacrylates | —$CH_2C(COOH)H$— |
| Polyureas | —NHCONH— |
| Polythioureas | —NH—C(S)—NH— |

The length of the bridging group will affect the properties of the polymeric material derived from this. This can be used to design polymers with properties which are best suited to the application. For instance when the bridging group comprises relatively long chains, (for example with in excess of 6 repeat units, for example from 6–20 repeat units), the polymer will have pliable plastic properties. Alternatively, when the bridging group is relatively short, (e.g. less than 6 repeat units) the material will be more brittle.

Thus, for example, a compound of formula IIA where the bridging group is of the polyethylene type and r is 2 will comprise a compound of formula (IIB)

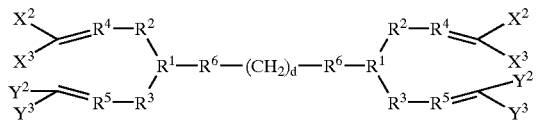

where $X^2$, $X^3$, $Y^2$, $Y^3$, $R^1$, $R^2$, $R^3$, $R^4$, $R^5$ and $R^6$ are as defined above and each group $X^2$, $X^3$, $Y^2$, $Y^3$, $R^1$, $R^2$, $R^3$, $R^4$, $R^5$ and $R^6$ may be the same or different to any other group, and d is an integer of from 6–20.

Another method for producing particular properties of the product arises from the possibility of producing copolymers where another monomeric compound, for example one which is not of formula (I), is mixed with the compound of formula (I) prior to polymerization. Such monomers are known in the art.

Examples of possible bridging groups $R^{16}$ where r is 2 are groups of sub-formula (VII)

where a and b are independently selected from 0, 1 or 2, $Z^1$, $Z^2$ and $Z^3$ are independently selected from a bond, an optionally substituted linear or branched alkyl or alkene chain wherein optionally one or more non-adjacent carbon atoms is replaced with a heteroatom or an amide group, $Q^1$ and $Q^2$ are independently selected from an optionally substituted carbocylic or heterocyclic ring which optionally contains bridging alkyl groups.

Suitable carbocyclic rings for $Q^1$ and $Q^2$ include cycloalkyl groups for example from 1 to 20 carbon atoms. Bridged carbocyclic ring structures include 1,4-bicyclo[2.2.2] octane, decalin, bicyclo[2.2.1] heptane, cubane, diadamantane, adamantane. Suitable heterocyclic rings include any of the above where one or more non adjacent carbon atoms are replaced by a heteroatom such as oxygen, sulphur or nitrogen (including amino or substituted amino), or a carboxyl or an amide group. Suitable optional substitutents for the groups $Q^1$ and $Q^2$ include one or more groups selected from alkyl, alkenyl, alkynyl, aryl, aralkyl such as benzyl, or functional groups as defined above. Substitutents for the groups $Q^1$ and $Q^2$ are oxo and halogen in particular fluorine and chlorine.

Suitable optional substituents for the alkyl and alkene groups $Z^1$, $Z^2$ and $Z^3$ include aryl, aralkyl and functional groups as defined above. Particular substituents include halogen such as fluorine and chlorine, and oxo.

Other sorts of bridging groups $R^{16}$ include electrically conducting chains, for instance, electrically conducting unsaturated chains such as alkenes or chains incorporating aromatic or heterocyclic rings. For instance, the group $R^{16}$ may comprise a tetra substituted conducting unit such as a tertathiafulvalene. Thus an example of such a compound is a compound of formula (VIII)

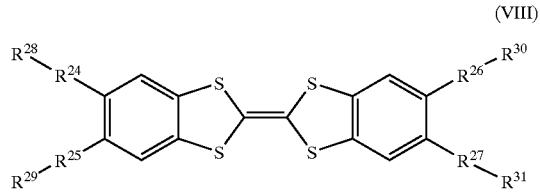

where $R^{28}$, $R^{29}$, $R^{30}$ and $R^{31}$ are each groups of sub-formula (IX)

where $R^1$, $R^2$, $R^3$, $R^4$, $R^5$ and $R^6$ are as defined in relation to formula (I) above and $R^{24}$, $R^{25}$, $R^{26}$ and $R^{27}$ are independently selected from groups of sub-formula (VII) as given above. In particular $R^{24}$, $R^{25}$, $R^{26}$ and $R^{27}$ are alkyl groups.

Polymerization of compounds of formula (VIII) will give cross-linked networks where the cross-linking occurs through the double bonded units. This will lead to a very stable material with robust physical properties. Once again, varying the length of the spacer groups $R^{24}$, $R^{25}$, $R^{26}$ and $R^{27}$ will lead to materials with designer properties. For instance when $R^{24}$, $R^{25}$, $R^{26}$ and $R^{27}$ are relatively long chains, the polymer will have pliable plastic properties. Alternatively, when the chains $R^{24}$, $R^{25}$, $R^{26}$ and $R^{27}$ are relatively short, the material will be more brittle.

Where $R^1$ and $R^6$ together form a group —$N^+R^7Z^-$, varying the counter ion $Z^-$ can also be used to adjust the physical properties of the polymer, such as water retention, porosity or conductivity. Suitably substituted materials will exhibit conducting properties, making them suitable as organic semiconductors for example for use as interconnects for IC chips etc.

Alternatively, a bridging group $R^{16}$ may comprise a tetra or octa substituted non-linear optic unit such as an optionally substituted porphyrin or phthalocyanine wherein the optional substitutents include hydrocarbyl groups as well as groups of sub formula (I). An example of such a porphyin compound is a compound of formula (X)

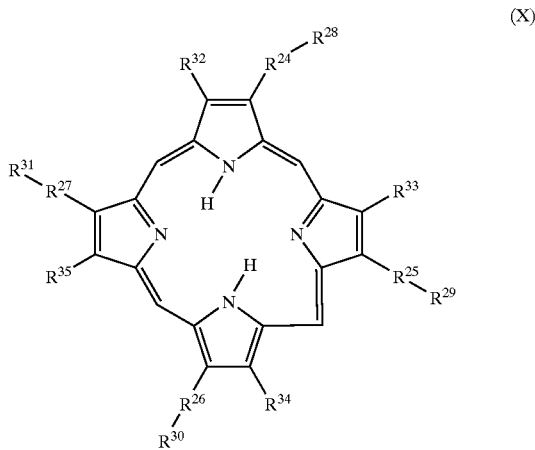

(X)

where $R^{24}$, $R^{25}$, $R^{26}$, $R^{27}$ $R^{28}$, $R^{29}$, $R^+$ and $R^{31}$ are as defined in relation to formula (VIII) above and $R^{32}$, $R^{33}$, $R^{34}$ and $R^{35}$ are each independently selected from hydrogen or hydrocarbyl groups; and the compound optionally contains a metal ion within the macrocyclic heterocyclic unit.

An alternative phthalocyanine compound is a compound of formula (XA)

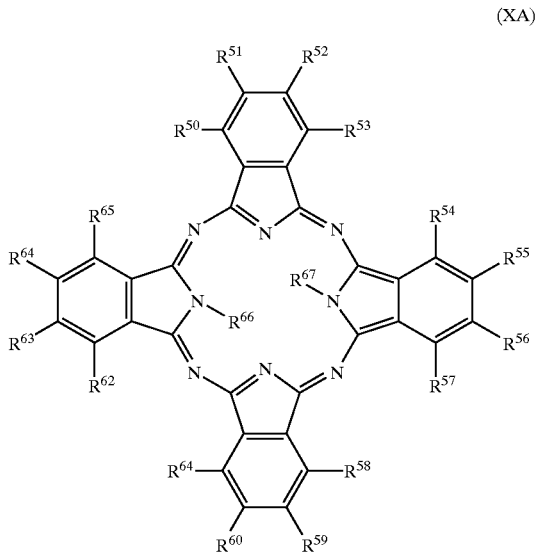

(XA)

where $R^{50}$ through to $R^{65}$ are independently selected from hydrocarbyl in particular $C_{1-12}$ alkyl, a group $OR^{68}$ where $R^{68}$ is hydrocarbyl in particular butyl, halogen in particular chlorine or a group $R^{24}$–$R^{28}$ where $R^{24}$ and $R^{28}$ are as defined in relation to formula (VIII) above, provided that at least two of $R^{50}$ to $R^{65}$ are $R^{24}$–$R^{28}$ groups, and $R^{66}$ and $R^{67}$ are either hydrogen or together comprise a metal ion such as a copper ion.

Preferably in formula (XA), $R^{51}$, $R^{52}$, $R^{55}$, $R^{56}$, $R^{59}$, $R^{60}$, $R^{63}$ and $R^{64}$ are halogen and $R^{50}$, $R^{53}$, $R^{54}$, $R^{57}$, $R^{58}$, $R^{61}$, $R^{62}$ and $R^{65}$ are independently $C_{1-12}$ alkyl, $C_{1-12}$ alkoxy or a group $R^{24}$–$R^{28}$.

Polymerization of a compound of formula (X) or (XA) during stereolithography in accordance with the scheme of FIG. 1, will provide a cross linked network polymer where the cross linking occurs through the diene units for example as either quaternery ammonium salts or amides depending upon the particular nature of the groups $R^1$ and $R^6$ present in the $R^{28}$, $R^{29}$, $R^{30}$ and $R^{31}$ units. Again this can produce a very stable network or elastomeric material with robust physical properties. In addition to conductivity, these polymers will be capable of exhibiting third order polarisabilities and be suitable for applications which employ the Kerr effect. These properties can be affected or moderated when metals or metal ions are inserted into the macrocyclic heterocyclic unit. Suitable metal ions include sodium, potassium, lithium, copper, zinc or iron ions.

Materials such as the compounds of formula (X) and (XA) which include metal ions such as copper might be particularly useful in the production of conducting layers for interconnects, useful in the production of say, 1000 MHz or more microprocessors. Copper doping of resin resists used as interconnects has been recognised as desirable by much of the electronics industry. By using a photopolymerizable material in accordance with the invention in the production of such microprocessors, reduce damage to substrate as compared to conventional hardening processes would be expected. In addition, the processing time could be reduced (conventional hardening processes typically require heating at temperatures of 120–350° C. for between 10 and 30 minutes). This would therefore improve on batch yield from a wafer.

Yet a further possibility for the bridging group $R^{16}$ is a polysiloxane network polymer where $R^{16}$ comprises a straight or branched siloxane chain of valency r or a cyclic polysiloxane unit.

Examples of such compounds are compounds of structure (XI)

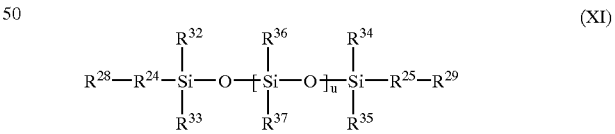

(XI)

where $R^{24}$, $R^{25}$, $R^{28}$ and $R^{29}$ are as defined above in relation to formula (VIII), $R^{32}$, $R^{33}$, $R^{34}$ are $R^{35}$, are as defined above in relation to formula (X) and in particular are each independently selected from hydrocarbyl such as alkyl and in particular methyl, and each $R^{36}$ or $R^{37}$ group is independently selected from hydrocarbyl or a group of formula $R^{26}$–$R^{30}$ where $R^{26}$ and $R^{30}$ are as defined above in relation to formula (VIII), and u is 0 or an integer of 1 or more, for example of from 1 to 20.

Other examples are compounds of formula (XII)

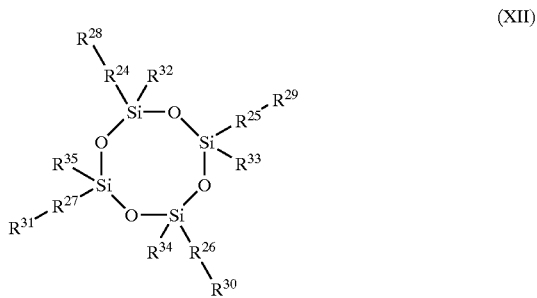

(XII)

where $R^{24}$, $R^{25}$, $R^{26}$, $R^{27}$, $R^{28}$, $R^{29}$, $R^{30}$ and $R^{31}$ are as defined above in relation to formula (VIII) and $R^{32}$, $R^{33}$, $R^{34}$ and $R^{35}$ are as defined above in relation to formula (X). Although formula (XII) has been illustrated with four siloxane units in the ring, it will be appreciated that there may be other numbers of such units in the cyclic ring, for example from 3 to 8, preferably from 3 to 6 siloxane units.

In the above structures (XI) and (XII), it will be appreciated that —Si— may be replaced by B or B$^-$; or —Si—O— is replaced by —B—N(R$^{39}$)— where R$^{39}$ is a hydrocarbyl group such as those defined above in relation to group $R^{32}$ in formula (XI) or a group —$R^{24}$-$R^{28}$ as defined in relation to formula (XII) above.

During stereolithography, compounds of formula (XI) and (XII) or variants thereof, will form a cross-linked network where the cross-linking occurs through the groups $R^{28}$, $R^{29}$, $R^{30}$ and $R^{31}$ as illustrated in FIG. 1. Such polymers may exhibit properties similar to those of conventional siloxanes. However, in the case of compounds of formula (XI) and (XII), they may be used in stereolithography.

Further examples of compounds of formula (II) include compounds of formula (XIII)

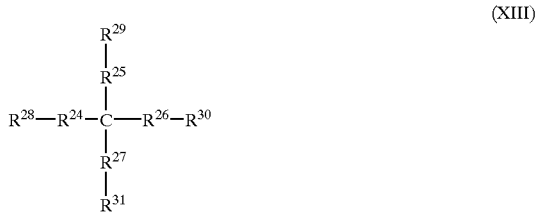

(XIII)

where $R^{24}$, $R^{25}$, $R^{26}$, $R^{27}$, $R^{28}$, $R^{29}$, $R^{30}$ and $R^{31}$ are as defined above in relation to formula (VIII).

Compounds of formula (II) are suitably prepared by conventional methods, for example by reacting a compound of formula (XV)

[XV]

where $X^1$, $Y^1$, $R^2$, $R^3$, $R^4$, $R^5$ and the dotted bonds are as defined in relation to formula (II), $R^{1'}$ is a group $R^1$ as defined in formula II or a precursor thereof, and $R^{40}$ is hydrogen or hydroxy, with a compound of formula (XVI)

$$R^{16}\text{—}[R^6\text{—}Z^4]_r \qquad (XVI)$$

where $R^6$, $R^{16}$ and r are as defined in relation to formula (II) and $Z^4$ is a leaving group, and thereafter if necessary, converting a precursor group $R^{1'}$ to a group $R^1$.

Where a compound of formula (IIA) is produced, the compound of formula (XV) will be of formula (XVA)

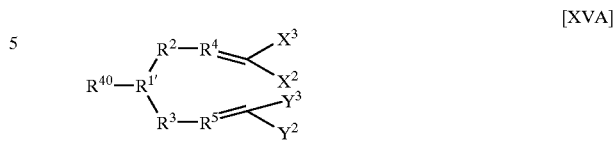

[XVA]

where $R^{1'}$, $R^2$, $R^3$, $R^4$, $R^5$, $R^{40}$, $X^2$, $X^3$, $Y^2$ and $Y^3$ are as defined above.

Suitable leaving groups $Z^4$ include halogen in particular bromo, mesylate or tosylate. The reaction is suitably effected in an organic solvent such as tetrahydrofuran, dichloromethane, toluene, an alcohol such as methanol or ethanol, or a ketone such as butanone and at elevated temperatures for example near the boiling point of the solvent. Preferably the reaction is effected in the presence of a base such as potassium carbonate.

When the group $R^{1'}$ is a precursor of the group $R^1$, it may be converted to the corresponding $R^{1'}$ group using conventional techniques. For example $R^{1'}$ may be a nitrogen atom, which may be converted to a group $NR^{12}(Z^{m-})_{1/m}$ where $R^{12}$, Z and m are as defined above, by reaction with an appropriate salt under conventional conditions. Examples of this are illustrated hereinafter.

Compounds of formulae (XV) and (XVI) are either known compounds or they can be prepared from known compounds by conventional methods.

During stereolithography, the compounds link together by way of the multiple bond, in particular the diene group as illustrated in FIG. 1. Where the compounds used include more than one diene grouping, for example compounds of formula (II) where R is 2 or more, they will tend to become cross linked to form a network or three dimensional structure. The degree of cross linking can be controlled by carrying out the polymerization in the presence of crosslinkers, where for example r is greater than 2, for example 4, or diluents. The latter will suitably comprise a compound of formula (XVI)

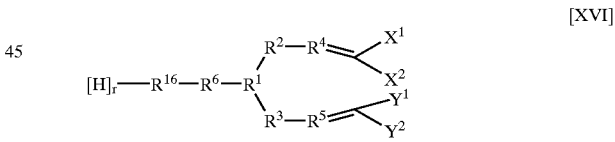

[XVI]

where $X^1$, $X^2$, $Y^1$, $Y^2$, $R^1$, $R^2$, $R^3$, $R^4$, $R^5$, $R^6$, $R^{16}$ and r are as defined in relation to formula (II).

Stereolithographic compositions which include the compounds described above may also comprise other components. In general, they will comprise a photoinitiator compound, and may additionally contain fillers, extenders, stabilisers, radiation absorbers, polarisers, solvents or other monomers as required.

Suitable photointiators include 2,2'-azobisisobutyronitrile (AIBN), aromatic ketones such as benzophenones in particular acetophenone; chlorinated acetophenones such as di- or tri-chloroacetophenone; dialkoxyacetophenones such as dimethoxyacetophenones (sold under the Trade name "Irgacure 651"); dialkylhydroxyacetophenones such as dimethylhydroxyacetophenone (sold under the Trade name "Darocure 1173"); substituted dialkylhydroxyacetophenone alkyl ethers such compounds of formula

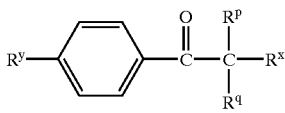

where $R^y$ is alkyl and in particular 2,2-dimethylethyl, $R^x$ is hydroxy or halogen such as chloro, and $R^p$ and $R^q$ are independently selected from alkyl or halogen such as chloro (examples of which are sold under the Trade names "Darocure 1116" and "Trigonal P1"); 1-benzoylcyclohexanol-2 (sold under the Trade name "Irgacure 184"); benzoin or derivatives such as benzoin acetate, benzoin alkyl ethers in particular benzoin butyl ether, dialkoxybenzoins such as dimethoxybenzoin or deoxybenzoin; dibenzyl ketone; acyloxime esters such as methyl or ethyl esters of acyloxime (sold under the trade name "Quantaqure PDO"); acylphosphine oxides, acylphosphonates such as dialkylacylphosphonate, ketosulphides for example of formula

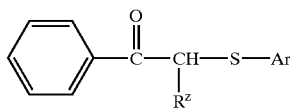

where $R^z$ is alkyl and Ar is an aryl group; dibenzoyl disulphides such as 4,4'-dialkylbenzoyldisulphide; diphenyldithiocarbonate; benzophenone; 4,4'-bis (N,N-dialkylamino)benzophenone; fluorenone; thioxanthone; benzil; or a compound of formula

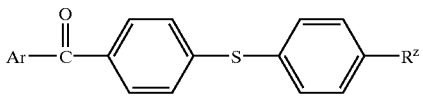

where Ar is an aryl group such as phenyl and $R^z$ is alkyl such as methyl (sold under the trade name "Speedcure BMDS").

Examples of fillers include inorganic particles and whiskers, for example as described in U.S. Pat. No. 5,929, 130. They are generally present in an amount of from 10–60% by weight of the composition.

Radiation energy absorbers where present, are typically present in small quantities, for example from 0.001 to 1% by weight of the composition. The precise nature of the absorber will depend upon the particular radiation being used and thus the wavelength of the radiation which is being controlled. Examples of such compounds include benzotriazole compounds, benzophenone compounds, phenyl salycilates and cyanoacrylates, for example as described in U.S. Pat. No. 5,849,459.

Suitable solvents include organic solvents such as alcohols like ethanol so as to make the composition workable for use in a stereolithographic process.

Other monomers, such as unsaturated urethanes of vinyl monomers may also be present in the composition if they are photocurable. This will result in the production of a copolymeric product which may have modified properties. Suitably, the compound of formula (I) will comprise from 10 to 100% of the polycurable component of the composition.

Composites may also be produced by including in the composition other moieties such as graphite, ethers such as crown ethers or thioethers, phthalocyanines, bipyridyls or liquid crystal compounds, all of which will produce composite polymers with modified properties.

Further additives which may be included in the compositions include stabilisers such as additives intended to prevent shrinkage of a three-dimensional object obtained by stereolithography. Such additives may include components which are soluble in the composition but separate from the composition on hardening to form a different phase such as those described in JP-A-3-20315. Polymeric coagulating materials which coagulate when heated such as those described in JP-A-3-104626 may also be included.

Other potential additives include polarising substances which control light irradiation. These may be helpful in ensuring that the optimum balance is achieved between the use of high light energy (needed to allow the process to proceed rapidly) whilst maintaining a uniform penetration depth. Examples of such compounds and their efficacy are described for instance in JP-A-3-15520, JP-A-3-41126, JP-A-3-114732 and JP-A-3-114733 The compositions can be used in a variety of conventional stereolithographic applications, for the production of three-dimensional objects such as plastic moulds, for example those used in the production of prototype devices such as domestic electrical appliances etc., intended for mass production.

The use of stereolithography compositions of the invention for the formation of semi-conductor features would be advantageous in that it would allow the formation of features on the substrate surface without the use of conventional patterning methods that require several process steps such as plasma etching and chemical etching. These two processes, no matter how carefully done, cause some form of electrical damage to the substrate itself and therefore increase the likelihood of source/drain and collector/drain leakage.

The production of semi-conductor features by curing of compositions of the invention would be beneficial, in particular if the layer you are depositing is of a conducting or an insulating layer (a polyimide material based would have good insulating and capacitance properties for example). Again the amount of damage when removing the excess from the unwanted areas of the substrate would be reduced, as a simple solvent clean should remove the uncrosslinked excess.

Thus the invention further provides a method of carrying out a stereolithographic process to produce a three-dimensional object, said method comprises use of a compound or a composition as described above.

Sterolithographic apparatus and conditions are well known in the art. Examples of suitable apparatus and systems are described in EP-A-250,121, U.S. Pat. Nos. 4,575, 330 and 5,922,364 and a review of the area is provided in Journal of Imaging Technology, 15:186–190 (190). A method for producing multilayer objects is described in U.S. Pat. No. 4,752,498. Compounds of the invention may be used in any of these techniques, provided that appropriate curing radiation, in particular u.v. or electron beam radiation is used.

The method of the invention can be used in the preparation of homopolymers or copolymers where they are mixed with other monomeric units, which may themselves be of a similar basic structure, for example of formula (II) or otherwise.

A general scheme illustrating the sort of polymerization process which may occur using a polyethylene type bridging group is illustrated in FIG. 2.

Using the method of the invention, it is possible to take a suitable organic system that has optimal or optimised properties for use in certain applications, e.g. high yield strength, large hyperpolarisability, high pyroelectric coefficient, high conductivity etc, and to structurally modify the system so that it is possible to polymerize it using stereolithography. If functional groups are incorporated that will polymerize, it will become possible to create a three-dimensional network or plastic that will have properties associated with the parent organic system.

Objects and particularly three-dimensional objects obtained using the method form a further aspect of the invention.

The production of compounds for use in the invention would be apparent to the person skilled in the art. Particular examples of compounds A are listed in Tables 2 to 7.

TABLE 2

| No. | $R^{70}$ | $R^{71}$ | Z |
|---|---|---|---|
| 1 | $(CH_2)_{10}$ | H | $CF_3COO^-$ |
| 2 | $(CH_2)_{10}$ | H | $PF_6^-$ |
| 3 | $(CH_2)_{10}$ | H | $Cl^-$ |
| 4 | $(CH_2)_{10}$ | H | $I^-$ |
| 5 | $(CH_2)_2$ | H | $PF_6^-$ |
| 6 | $(CH_2)_{12}$ | $CH_3$ | $I^-$ |
| 7 | $(CH_2)_{10}$ | H | $BF_4^-$ |
| 8 | $(CH_2)_4N^+(CH_2CH=CH_2)(CH_2)_3$—  $Br^-$ | H | $Br^-$ |

TABLE 3

| No. | $R^{73}$ | $R^{74}$ | f | g |
|---|---|---|---|---|
| 9 | $CH_2O(CH_2)_2O(CH_2)_2OCH_2$ | H | 0 | 0 |
| 10 | $CH_2O(CH_2)_2O(CH_2)_2OCH_2$ | H | 1 | 0 |
| 11 | $CH_2O(CH_2)_2O(CH_2)_2OCH_2$ | $CH_3$ | 1 | 1 |
| 12 | $CH_2O(CH_2)_5OCH_2$ | H | 1 | 0 |
| 13 | $(CH_2)_8$ | H | 0 | 0 |
| 14 | $CH_2(OCH_2CH_2)_{12}OCH_2$ | H | 0 | 0 |
| 13 | $(CH_2)_8$ | H | 1 | 0 |

TABLE 4

| No. | $R^{75}$ | j | k |
|---|---|---|---|
| 14 | $CH_2(OCH_2CH_2)_{12}OCH_2$ | 1 | 1 |
| 15 | $(CH_2)_8$ | 1 | 1 |
| 16 | $(CH_2)_{18}$ | 1 | 1 |
| 17 | $(CF_2)_{10}$ | 1 | 1 |
| 18 | $CH_2OCH_2CH_2OCH_2$ | 1 | 1 |

TABLE 4-continued

| No. | $R^{75}$ | j | k |
|---|---|---|---|
| 19 | (structure shown) | 1 | 1 |
| 20† | $(CH_2)_6$ | 1 | 1 |
| 21 | bond | 1 | 1 |
| 22 | $CH_2$ | 1 | 1 |

*indicates point of attachment to adjacent groups
†indicates hydrochloride salt

TABLE 5

| No. | $R^{76}$ | $R^{77}$ | Z |
|---|---|---|---|
| 23 | —$CH_2CH=CH_2$ | $CH_2CH=CH_2$ | $Br^-$ |
| 24 | —$(CH_2)_7CH_3$ | H | $Br^-$ |
| 25 | —$CH_2CH_2OH$ | —$CH_2CH_2OH$ | $Br^-$ |
| 26 | —$(CH_2)_6OH$ | H | $Cl^-$ |
| 27 | —$CH_2CH=CH$ | H | $PF_6^-$ |

TABLE 6

| No. | $R^{78}$ | $R^{79}$ |
|---|---|---|
| 28 | $C_6H_5$ | C |
| 29 | —$(CH_2)_5CH_3$ | C |
| 30 | —$CH=CH_2$ | C |
| 31 | —$(CH_2)_2COOH$ | C |
| 32 | —$CF_3$ | C |
| 33 | —$CH_2CN$ | C |
| 34 | $CH_3$ | S(O) |
| 35 | —$CH_2N(CH_2CH_2OH)_2$ | C |
| 36 | —$(CH_2)_3COOH$ | C |
| 37 | —$CH_2Br$ | C |
| 38 | —$(CF_2)_3COOH$ | C |
| 39 | $(CH_2)_2COO^-$ $^+NH(CH_2CH_2OH)_3$ | C |
| 40 | $(CH_2)_2COO^-$ $^+NH_3(C(OH)(CH_2OH)_2)$ | C |
| 41 | —$(CH_2)_2COO^-$ $Li^+$ | C |
| 42 | —$(CH_2)_3COO$(3-fluorophenyl) | C |
| 43 | —$C(=CH_2)CH_2COOH$ | C |
| 44 | 4-hydroxyphenyl | C |

TABLE 6-continued

| No. | $R^{78}$ | $R^{79}$ |
|---|---|---|
| 45 | —C(CH$_3$)=CHCOOH | C |
| 46 | —CH=C(CH$_3$)COOH | C |
| 47 | (structure shown) | C |
| 48 | —(CH$_2$)$_3$OH | C |
| 49 | —(CH$_2$)$_3$OC(O)CH=CH$_2$ | C |
| 50 | benzyloxy | C |
| 51 | —(CH$_2$)$_3$CONH(CH$_2$)$_3$Si(OCH$_3$)$_3$ | C |

TABLE 7

| No. | Structure |
|---|---|
| 52 | (structure shown) |
| 53 | (structure shown) |
| 54 | (structure shown) |

The preparation of these compounds is described in WO 00/06610.

What is claimed is:

1. A method of carrying out a stereolithographic process to produce a three-dimensional object, said method comprising the steps of:

(i) supporting on a surface compound A, which comprises a group of sub-formula (I)

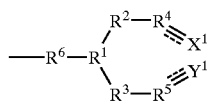

[I]

where $R^1$ is $CR^{a'}$ where $R^{a'}$ is hydrogen or alkyl, and $R^6$ is a bond or $R^1$ and $R^6$ together form an electron withdrawing group;

$R^2$ and $R^3$ are independently selected from $(CR^7R^8)_n$, or a group $CR^9R^{10}$, $CR^7R^8CR^9R^{10}$ or $CR^9R^{10}CR^7R^8$ where n is 0, 1 or 2, $R^7$ and $R^8$ are independently selected from hydrogen or alkyl, and either one of $R^9$ or $R^{10}$ is hydrogen and the other is an electron withdrawing group, or $R^9$ and $R^{10}$ together form an electron withdrawing group, and $R^4$ and $R^5$ are independently selected from C, CH or $CR^{11}$ where $R^{11}$ is an electron withdrawing group;

the dotted lines indicate the presence or absence of a bond, and $X^1$ is a group $CX^2X^3$ where the dotted line bond to which it is attached is absent and a group $CX^2$ where the dotted line bond to which it is attached is present, $Y^1$ is a group $CY^2Y^3$ where the dotted line bond to which it is attached is absent and a group $CY^2$ where the dotted line bond to which it is attached is present, and $X^2$, $X^3$, $Y^2$ and $Y^3$ are independently selected from hydrogen and fluorine;

provided that at least one of (a) $R^1$ and $R^6$ or (b) $R^2$ and $R^3$ or (c) $R^4$ and $R^5$ includes an electron withdrawing group that activates the cyclopolymerization reaction when irradiated, optionally in the presence of a photoinitiator;

(ii) irradiating said compound to produce a first layer of hardened polymer therefrom; and then (iii) supporting further compound on the formed polymer and irradiating it to produce a successive hardened layer of polymer to produce the desired three-dimensional object.

2. The method according to claim 1 wherein a group of sub-formula (I) is a group of sub-formula (IA)

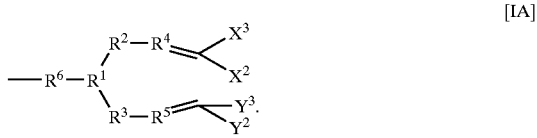

[IA]

3. The method according to claim 1 wherein compound A is a compound of (II)

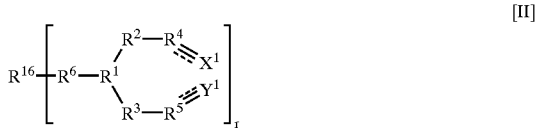

[II]

where r is an integer of 1 or more, and $R^{16}$ is a bridging group, an optionally substituted hydrocarbyl group, a perhaloalkyl group or an amide, of valency r.

4. The method according to claim 3 wherein the compound of formula (II) is a compound of formula (IIA)

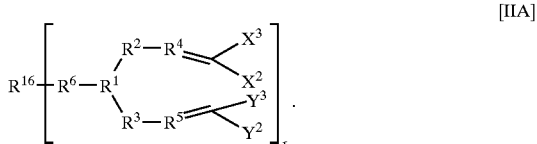

[IIA]

5. The method according to claim 3 wherein in compound A, r is greater than one.

6. The method according to claim 5 wherein r is an integer of from 2 to 8.

7. The method according to claim 3 wherein and r is 2 and $R^{16}$ is a group of sub-formula (VII)

$$—Z^1—(Q^1)_a—(Z^2—Q^2)_b—Z^3—$$  (VII)

where a and b are independently selected from 0, 1 or 2, $Z^1$, $Z^2$ and $Z^3$ are independently selected from a bond, an optionally substituted linear or branched alkyl or alkene chain wherein optionally one or more non-adjacent carbon atoms is replaced with a heteroatom or an amide group, and $Q^1$ and $Q^2$ are independently selected from an optionally substituted carbocyclic or heterocyclic ring which optionally contains bridging alkyl groups.

8. The method according to claim 3 wherein $R^{16}$ is an electrically conducting chain.

9. The method according to claim 8 wherein the compound A is a compound of formula (VIII)

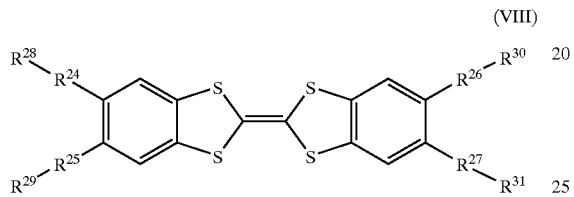

(VIII)

where $R^{28}$, $R^{29}$, $R^{30}$ and $R^-$ are each groups of sub-formula (IX)

[IX]

where $R^{24}$, $R^{25}$, $R^{26}$ and $R^{27}$ are independently selected from groups of sub-formula (VII)

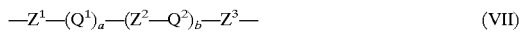

(VII)

where a and b are independently selected from 0, 1 or 2, $Z^1$, $Z^2$ and $Z^3$ are independently selected from a bond, an optionally substituted linear or branched alkyl or alkene chain wherein optionally one or more non-adjacent carbon atoms is replaced with a heteroatom or an amide group, and $Q^1$ and $Q^2$ are independently selected from an optionally substituted carbocyclic or heterocyclic ring which optionally contains bridging alkyl groups.

10. The method according to claim 3 wherein the bridging group $R^{16}$ is a tetra or octa substituted non-linear optic unit selected from an optionally substituted porphyrin or phthalocyanine.

11. The method according to claim 10 wherein the compound A is a porphyrin compound of formula (X)

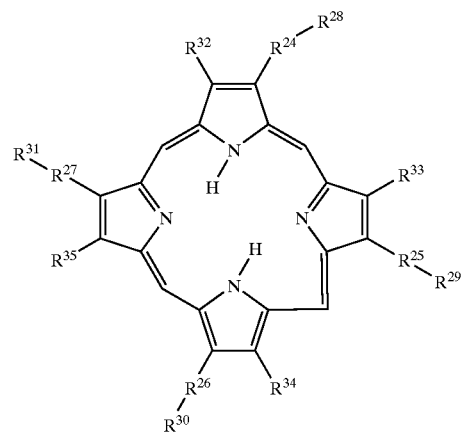

(X)

wherein $R^{24}$, $R^{25}$, $R^{26}$, and $R^{27}$ are independently selected from groups of sub-formula (VII)

(VII);

where a and b are independently selected from 0, 1, or 2, $Z^1$, $Z^2$ and $Z^3$ are independently selected from a bond, an optionally substituted linear or branched alkyl or alkene chain wherein optionally one or more non-adjacent carbon atoms is replaced with a heteroatom or an amide group, and $Q^1$ and $Q^2$ are independently selected from an optionally substituted carbocyclic or heterocyclic ring which optionally contains bridging alkyl groups, $R^{28}$, $R^{29}$, $R^{30}$ and $R^{31}$ are independently selected from groups of sub-formula (IX)

[IX]

where $R^1$ is $CR^{a'}$ where $R^{a'}$ is hydrogen or alkyl, and $R^6$ is a bond, or $R^1$ and $R^6$ together form an electron withdrawing group;

$R^2$ and $R^3$ are independently selected from $(CR^7R^8)_n$, or a group $CR^9R^{10}$, $CR^7R^8CR^9R^{10}$ or $CR^9R^{10}CR^7R^8$ where n is 0, 1 or 2, $R^7$ and $R^8$ are independently selected from hydrogen or alkyl, and either one of $R^9$ or $R^{10}$ is hydrogen and the other is an electron withdrawing group, or $R^9$ and $R^{10}$ together form an electron withdrawing group, and $R^4$ and $R^5$ are independently selected from C, CH or $CR^{11}$ where $R^{11}$ is an electron withdrawing group;

where $R^{32}$, $R^{33}$, $R^{34}$ and $R^{35}$ are each independently selected from hydrogen or hydrocarbyl groups; and wherein the compound optionally contains a metal ion within the macrocyclic heterocyclic unit.

12. The method according to claim 11 wherein the compound contains a copper ion.

13. The method according to claim 10 wherein the compound A is a phthalocyanine compound or formula (XA)

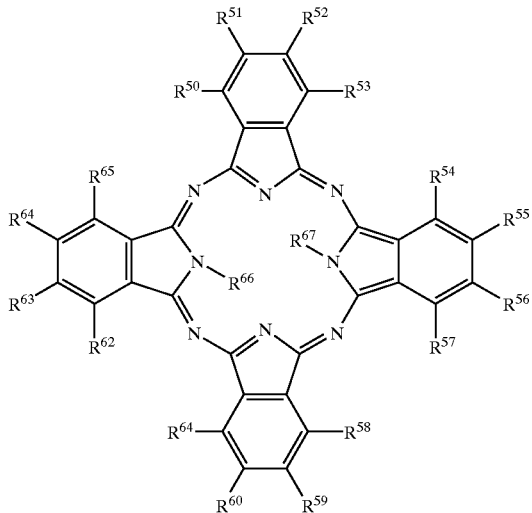

(XA)

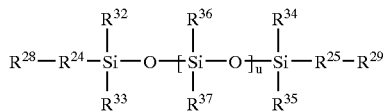

(XI)

wherein $R^{32}$, $R^{33}$, $R^{34}$ and $R^{35}$, are each independently selected from hydrogen or hydrocarbyl groups, and each $R^{36}$ or $R^{37}$ group is independently selected from hydrocarbyl or a group of formula $R^{26}$–$R^{30}$ where $R^{24}$, $R^{25}$, and $R^{26}$ are each independently selected from groups of sub-formula (VII)

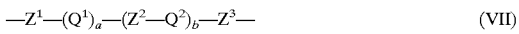

(VII)

where a and b are independently selected from 0, 1, or 2, $Z^1$, $Z^2$ and $Z^3$ are independently selected form a bond, an optionally substituted linear or branched alkyl or alkene chain wherein optionally one or more non-adjacent carbon atoms is replaced with a heteroatom or an amide group, and $Q^1$ and $Q^2$ are independently selected from an optionally substituted carbocyclic or heterocyclic ring which optionally contains bridging alkyl groups, and $R^{28}$, $R^{29}$ and $R^{30}$ are each independently selected from a group of sub-formula (IX)

where $R^{50}$ through to $R^{65}$ are independently selected from hydrocarbyl a group $OR^{68}$ where $R^{68}$ is hydrocarbyl, halogen or a group $R^{24}$–$R^{28}$
where $R^{24}$ and $R^{28}$ are selected from groups of sub formula (VII)

(VII)

where a and b are independently selected from 0, 1 or 2, $Z^1$, $Z^2$ and $Z^3$ are independently selected from a bond, an optionally substituted linear or branched alkyl or alkene chain wherein optionally one or more non-adjacent carbon atoms is replaced with a heteroatom or an amide group, and $Q^1$ and $Q^2$ are independently selected from an optionally substituted carbocyclic or heterocyclic ring which optionally contains bridging alkyl groups,
and where $R^{28}$ is selected from a group of sub-formula (IX)

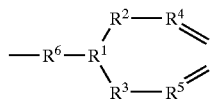

[IX]

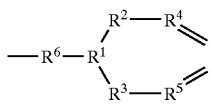

[IX]

where $R^1$ is $CR^{a'}$ where $R^{a'}$ is hydrogen or alkyl, and $R^6$ is a bond, or $R^1$ and $R^6$ together form an electron withdrawing group; $R^2$ and $R^3$ are independently selected from $(CR^7R^8)_n$, or a group $CR^9R^{10}$, $CR^7R^8CR^9R^{10}$ or $CR^9R^{10}CR^7R^8$ where n is 0, 1 or 2, $R^7$ and $R^8$ are independently selected from hydrogen or alkyl, and either one of $R^9$ or $R^{10}$ is hydrogen and the other is an electron withdrawing group, or $R^9$ and $R^{10}$ together form an electron withdrawing group; $R^4$ and $R^5$ are independently selected from C, CH or $CR^{11}$ where $R^{11}$ is an electron withdrawing group;
provided that at least two of $R^{50}$ to $R^{65}$ are $R^{24}$–$R^{28}$ groups, and $R^{66}$ and $R^{67}$ are either hydrogen or together comprise a metal ion.

14. The method according to claim 3 wherein the bridging group $R^{16}$ is a polysiloxane network polymer where $R^{16}$ comprises a straight or branched siloxane chain of valency r or a cyclic polysiloxane unit.

15. The method according to claim 14 wherein the compound A is a compound of structure (XI)

where $R^1$ is $CR^{a'}$ where $R^{a'}$ is hydrogen or alkyl, and $R^6$ is a bond, or $R^1$ and $R^6$ together form an electron withdrawing group; $R^2$ and $R^3$ are independently selected from $(CR^7R^8)_n$, or a group $CR^9R^{10}$, $CR^7R^8CR^9R^{10}$ or $CR^9R^{10}CR^7R^8$ where n is 0, 1 or 2, $R^7$ and $R^8$ are independently selected from hydrogen or alkyl, and either one of $R^9$ or $R^{10}$ is hydrogen and the other is an electron withdrawing group, or $R^9$ and $R^{10}$ together form an electron withdrawing group, and $R^4$ and $R^5$ are independently selected from C, CH or $CR^{11}$ where $R^{11}$ is an electron withdrawing group; and u is 0 or an integer of from 1 to 20.

16. The method according to claim 14 where the compound A is a compound of formula (XII)

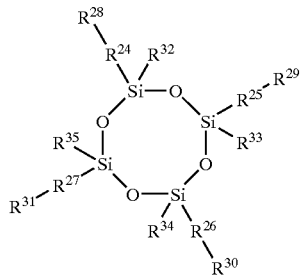

(XII)

or a modified form of said compound for formula (XII) with either 3 or 5 to 8 siloxane units wherein $R^{24}$, $R^{25}$, $R^{26}$, and $R^{27}$ are independently selected from groups of sub-formula (VII)

(VII);

where a and b are independently selected from 0, 1, or 2, $Z^1$, $Z^2$ and $Z^3$ are independently selected from a bond, an optionally substituted linear or branched alkyl or alkene chain wherein optionally one or more non-adjacent carbon atoms is replaced with a heteroatom or an amide group, and $Q^1$ and $Q^2$ are independently selected from an optionally substituted carbocyclic or heterocyclic ting which optionally contains bridging alkyl groups, $R^{28}$, $R^{29}$, $R^{30}$ and $R^{31}$ are independently selected from groups of sub-formula (IX)

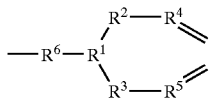
(IX)

where $R^1$ is $CR^{a'}$ where $R^{a'}$ is hydrogen or alkyl, and $R^6$ is a bond, or $R^1$ and $R^6$ together form an electron withdrawing group;

$R^2$ and $R^3$ are independently selected from $(CR^7R^8)_n$, or a group $CR^9R^{10}$, $CR^7R^8CR^9R^{10}$ or $CR^9R^{10}CR^7R^8$ where n is 0, 1 or 2, $R^7$ and $R^8$ are independently selected from hydrogen or alkyl, and either one of $R^9$ or $R^{10}$ is hydrogen and the other is an electron withdrawing group, or $R^9$ and $R^{10}$ together form an electron withdrawing group;

$R^4$ and $R^5$ are independently selected from C, CH or $CR^{11}$ where $R^{11}$ is an electron withdrawing group; and $R^{32}$, $R^{33}$, $R^{34}$ and $R^{35}$, are each independently selected from hydrogen or hydrocarbyl groups.

17. The method according to claim 3 where compound A has the structure (XI) or (XII) as defined below but in which at least one —Si— group has been replaced by B or B⁻; or at least one —Si—O— group has been replaced by —B—N ($R^{39}$)— where $R^{39}$ is a hydrocarbyl group or a group —$R^{24}$–$R^{28}$, where $R^{24}$ and $R^{28}$ are defined below;

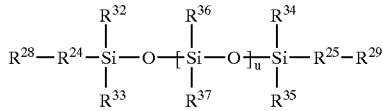
(XI)

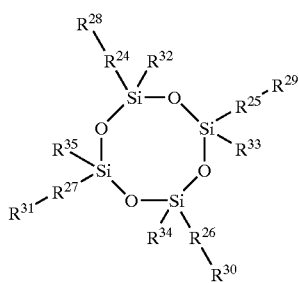
(XII)

wherein $R^{24}$, $R^{25}$, $R^{26}$, and $R^{27}$ are independently selected from groups of sub-formula (VII)

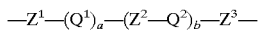
(VII)

where a and b are independently selected from 0, 1, or 2, $Z^1$, $Z^2$ and $Z^3$ are independently selected form a bond, an optionally substituted linear or branched alkyl or alkene chain wherein optionally one or more non-adjacent carbon atoms is replaced with a heteroatom or an amide group, and $Q^1$ and $Q^2$ are independently selected from an optionally substituted carbocyclic or heterocyclic ring which optionally contains bridging alkyl groups, $R^{28}$, $R^{29}$, $R^{30}$ and $R^{31}$ are independently selected from groups of sub-formula (IX)

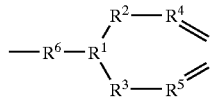
[IX]

where $R^1$ is $CR^{a'}$ where $R^{a'}$ is hydrogen or alkyl, and $R^6$ is a bond, or $R^1$ and $R^6$ together form an electron withdrawing group;

$R^2$ and $R^3$ are independently selected from $(CR^7R^8)_n$, or a group $CR^9R^{10}$, $CR^7R^8CR^9R^{10}$ or $CR^9R^{10}CR^7R^8$ where n is 0, 1 or 2, $R^7$ and $R^8$ are independently selected from hydrogen or alkyl, and either one of $R^9$ or $R^{10}$ is hydrogen and the other is an electron withdrawing group, or $R^9$ and $R^{10}$ together form an electron withdrawing group, and $R^4$ and $R^5$ are independently selected from C, CH or $CR^{11}$ where $R^{11}$ is an electron withdrawing group;

$R^{32}$, $R^{33}$, $R^{34}$ and $R^{35}$, are each independently selected from hydrogen or hydrocarbyl groups, and each $R^{36}$ or $R^{37}$ group is independently selected from hydrocarbyl or a group of formula $R^{26}$–$R^{30}$;

and u is 0 or an integer of from 1 to 20.

18. The method according to claim 3 wherein the compound A is a compound of formula (XIII)

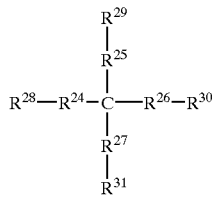
(XIII)

wherein $R^{24}$, $R^{25}$, $R^{26}$, and $R^{27}$ are independently selected from groups of sub-formula (VII)

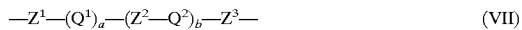
(VII)

where a and b are independently selected from 0, 1, or 2, $Z^1$, $Z^2$ and $Z^3$ are independently selected form a bond, an optionally substituted linear or branched alkyl or alkene chain wherein optionally one or more non-adjacent carbon atoms is replaced with a heteroatom or an amide group, and $Q^1$ and $Q^2$ are independently selected from an optionally substituted carbocyclic or heterocyclic ring which optionally contains bridging alkyl groups, and $R^{28}$, $R^{29}$, $R^{30}$ and $R^{31}$ are independently selected from groups of sub-formula (IX)

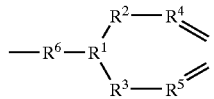
[IX]

where $R^1$ is $CR^{a'}$ where $R^{a'}$is hydrogen or alkyl, and $R^6$ is a bond, or $R^1$ and $R^6$ together form an electron withdrawing group;

$R^2$ and $R^3$ are independently selected from $(CR^7R^8)_n$, or a group $CR^9R^{10}$, $CR^7R^8CR^9R^{10}$ or $CR^9R^{10}CR^7R^8$ where n is 0, 1 or 2, $R^7$ and $R^8$ are independently selected from hydrogen or alkyl, and either one of $R^9$ or $R^{10}$ is hydrogen and the other is an electron withdrawing group, or $R^9$ and $R^{10}$ together form an electron withdrawing group, and $R^4$ and $R^5$ are independently selected from C, CH or $CR^{11}$ where $R^{11}$ an electron withdrawing group.

19. The method according to claim 1 wherein at least $R^1$ and $R^6$ form an election withdrawing group.

20. The method according to claim 19 wherein in the compound, either
   (i) $R^1$ is a group $N^+R^{12}(Z^{m-})_{1/m}$, $S(O)_pR^{13}$, B, $P(O)_qR^{14}$ or $Si(R^{15})$ where $R^{12}$, $R^{13}$, $R^{14}$ and $R^{15}$ are independently selected from hydrogen or hydrocarbyl, Z is an anion of charge m, p is 0, 1 or 2, and q is 1 or 2; and $R^6$ is a bond; or
   (ii) $R^1$ is a nitrogen atom and $R^6$ is C(O) or $S(O)_2$; or
   (iii) $R^1$ is a CH group and $R^6$ a group OC(O), C(O) or $S(O)_2$.

21. The method according to claim 1 wherein in the group of sub-formula (I), $X^2$, $X^3$, $Y^2$ and $Y^3$ are all hydrogen.

22. The method according to claim 1 wherein compound A is a compound of formula

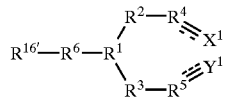

[III]

wherein $R^{16'}$ is an optionally substituted hydrocarbyl group, a perhaloalkyl group or an amide.

23. The method according to claim 22 wherein the compound of formula (III) is a compound of formula (IIIA)

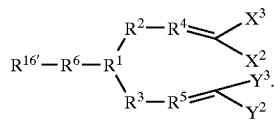

[IIIA]

24. The method according to claim 1 wherein the compound A is a compound of formula (IV)

[IV]

25. The method according to claim 24 wherein in the compound of formula (IV), $R^{16'}$ is optionally substituted alkyl, optionally substituted alkenyl, optionally substituted alkynyl or optionally substituted aryl group, wherein the optional substituents are selected from halogen, hydroxy, carboxy or salts thereof or acyloxy.

26. The method according to claim 24 wherein $R^{16'}$ in formula (IV) is a perhaloalkyl group.

27. The method according to claim 24 wherein $R^{16'}$ is a dialkenyl substituted amide of sub formula (V)

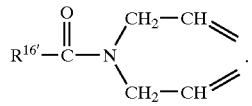

(V)

where $R^{18}$ and $R^{19}$ are independently selected from $(CR^7R^8)_n$, or a group $CR^9R^{10}$, $CR^7R^8CR^9R^{10}$ or $CR^9R^{10}CR^7R^8$ where n is 0, 1 or 2, $R^7$ and $R^8$ are independently selected from hydrogen or alkyl, and either one of $R^9$ or $R^{10}$ is hydrogen and the other is an electron withdrawing group, or $R^9$ and $R^{10}$ together form an electron withdrawing group, and $R^{20}$ and $R^{21}$ are independently selected from C, CH or $CR^{11}$ where $R^{11}$ is an electron withdrawing group.

28. The method according to claim 1 wherein the compound A is a radiation curable compound of formula (VI)

[VI]

where Z is an anion of charge m and $R^{22}$ and $R^{23}$ are independently selected from hydrogen and hydrocarbyl.

29. A three dimensional object obtained by a method according to claim 1.

* * * * *